(12) United States Patent
Aoki et al.

(10) Patent No.: US 10,910,995 B2
(45) Date of Patent: Feb. 2, 2021

(54) OSCILLATOR, ELECTRONIC DEVICE, AND VEHICLE

(71) Applicant: SEIKO EPSON CORPORATION, Tokyo (JP)

(72) Inventors: Shinya Aoki, Minowa-machi (JP); Ryuta Nishizawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/796,472

(22) Filed: Feb. 20, 2020

(65) Prior Publication Data

US 2020/0274486 A1 Aug. 27, 2020

(30) Foreign Application Priority Data

Feb. 22, 2019 (JP) ................................ 2019-031050

(51) Int. Cl.
*G01N 27/00* (2006.01)
*G08B 19/00* (2006.01)
*G08B 21/00* (2006.01)
*H03B 5/04* (2006.01)
*H03B 5/32* (2006.01)

(52) U.S. Cl.
CPC ................ *H03B 5/04* (2013.01); *H03B 5/32* (2013.01); *H03B 2200/0018* (2013.01)

(58) Field of Classification Search
CPC ..... H03B 5/04; H03B 5/32; H03B 2200/0018
USPC ......................................................... 331/66
See application file for complete search history.

(56) References Cited

U.S. PATENT DOCUMENTS

| 8,089,325 | B2 * | 1/2012 | Kudo | H03L 1/04 331/158 |
| 2011/0234325 | A1 * | 9/2011 | Tanaka | H03L 1/022 331/68 |
| 2014/0152392 | A1 | 6/2014 | Owaki et al. | |
| 2016/0285461 | A1 * | 9/2016 | Okubo | H03L 1/023 |
| 2017/0272082 | A1 * | 9/2017 | Obata | H03B 1/02 |
| 2017/0272083 | A1 | 9/2017 | Owaki et al. | |
| 2017/0373637 | A1 * | 12/2017 | Kondo | H03H 9/0519 |
| 2018/0198408 | A1 | 7/2018 | Owaki et al. | |
| 2018/0269832 | A1 | 9/2018 | Obata | |
| 2018/0278209 | A1 | 9/2018 | Obata et al. | |

FOREIGN PATENT DOCUMENTS

| JP | 2005-286892 | 10/2005 |
| JP | 2014-103627 | 6/2014 |
| JP | 2014-107862 | 6/2014 |

(Continued)

*Primary Examiner* — Richard Tan
(74) *Attorney, Agent, or Firm* — Workman Nydegger

(57) ABSTRACT

An oscillator includes a first container, a second container accommodated in the first container, a resonator element accommodated in the second container, a temperature sensor accommodated in the second container, a first circuit element that is accommodated in the second container and includes an oscillation circuit that causes the resonator element to oscillate so as to generate an oscillation signal on which temperature compensation is performed based on a detected temperature of the temperature sensor, and a second circuit element that is accommodated in the first container and includes a frequency control circuit that controls a frequency of the oscillation signal. The second container and the second circuit element are stacked.

7 Claims, 10 Drawing Sheets

(56) References Cited

FOREIGN PATENT DOCUMENTS

| JP | 2017-175202 | 9/2017 |
| JP | 2017-175203 | 9/2017 |
| JP | 2018-113603 | 7/2018 |
| JP | 2018-142899 | 9/2018 |
| JP | 2018-157377 | 10/2018 |
| JP | 2018-160892 | 10/2018 |

* cited by examiner

OSCILLATOR, ELECTRONIC DEVICE, AND VEHICLE

The present application is based on, and claims priority from JP Application Serial Number 2019-031050, filed Feb. 22, 2019, the disclosure of which is hereby incorporated by reference herein in its entirety.

BACKGROUND

1. Technical Field

The present disclosure relates to an oscillator, an electronic device, and a vehicle.

2. Related Art

JP-A-2017-175202 discloses an oscillator including an outer package, an inner package accommodated in the outer package, a resonator element accommodated in the inner package, and a circuit element which is accommodated in the outer package and is disposed on the inner package. In the oscillator disclosed in JP-A-2017-175202, the circuit element includes a temperature sensor, and a frequency of an output signal is corrected based on the temperature detected by the temperature sensor.

However, in the oscillator disclosed in JP-A-2017-175202, the circuit element including the temperature sensor is located outside the inner package in which the resonator element is accommodated. Thus, a temperature difference between the temperature sensor and the resonator element easily occurs, and it is difficult to correct the output signal with high accuracy. Therefore, frequency accuracy of the output signal may be degraded.

SUMMARY

An oscillator according to an application example of the present disclosure includes a first container, a second container accommodated in the first container, a resonator element accommodated in the second container, a temperature sensor accommodated in the second container, a first circuit element that is accommodated in the second container and includes an oscillation circuit that causes the resonator element to oscillate so as to generate an oscillation signal on which temperature compensation is performed based on a detected temperature of the temperature sensor, and a second circuit element that is accommodated in the first container and includes a frequency control circuit that controls a frequency of the oscillation signal. The second container and the second circuit element are stacked.

In the oscillator according to the application example, the first container may include a first base substrate and a first lid bonded to the first base substrate, and has an internal space in which the second container and the second circuit element are accommodated. The second circuit element may be mounted on the first base substrate. The second container may be mounted on the second circuit element.

In the oscillator according to the application example, the second container may be bonded to the second circuit element through an insulating bonding member. The second circuit element may be bonded to the first base substrate through a conductive bonding member.

In the oscillator according to the application example, the second container may include a temperature output terminal from which an output voltage of the temperature sensor is output. The temperature output terminal may be electrically coupled to the frequency control circuit.

In the oscillator according to the application example, the frequency control circuit may include an inductor. The second container may not overlap the inductor in plan view.

In the oscillator according to the application example, the second container may include a power supply terminal to which a power supply voltage to be supplied to the oscillation circuit is applied. The oscillator may further include a bypass capacitor which is accommodated in the first container and is coupled to the power supply terminal.

An oscillator according to an application example of the present disclosure includes a first container, a second container that is accommodated in the first container and includes a base substrate and a lid bonded to one main surface of the base substrate, and has an internal space, a resonator element that is accommodated in the internal space and is disposed on the one main surface side of the base substrate, a temperature sensor disposed on the other main surface side of the base substrate, a first circuit element that is disposed on the other main surface side of the base substrate and includes an oscillation circuit that causes the resonator element to oscillate so as to generate an oscillation signal on which temperature compensation is performed based on a detected temperature of the temperature sensor, and a second circuit element that is accommodated in the first container and includes a frequency control circuit that controls a frequency of the oscillation signal. The second container and the second circuit element are stacked.

An electronic device according to an application example of the present disclosure includes the above-described oscillator and a signal processing circuit that performs signal processing based on an output signal of the oscillator.

A vehicle according to an application example of the present disclosure includes the above-described oscillator and a signal processing circuit that performs signal processing based on an output signal of the oscillator.

DESCRIPTION OF EXEMPLARY EMBODIMENTS

Hereinafter, an oscillator, an electronic device, and a vehicle according to the preferred embodiments will be described with reference to the accompanying drawings.

First Embodiment

Figure 1:
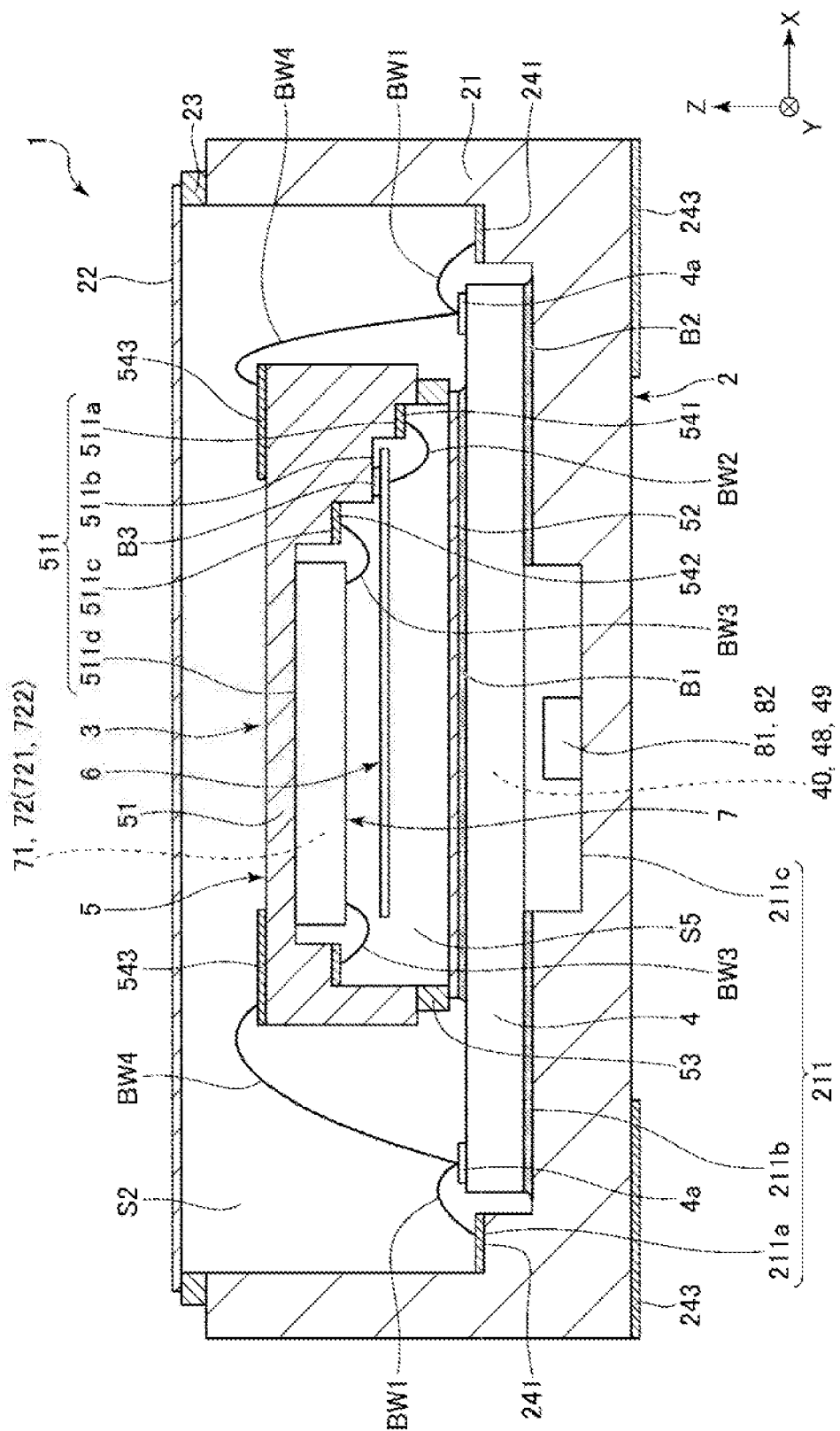
FIG. 1 is a cross-sectional view illustrating an oscillator according to a first embodiment.
Figure 2:
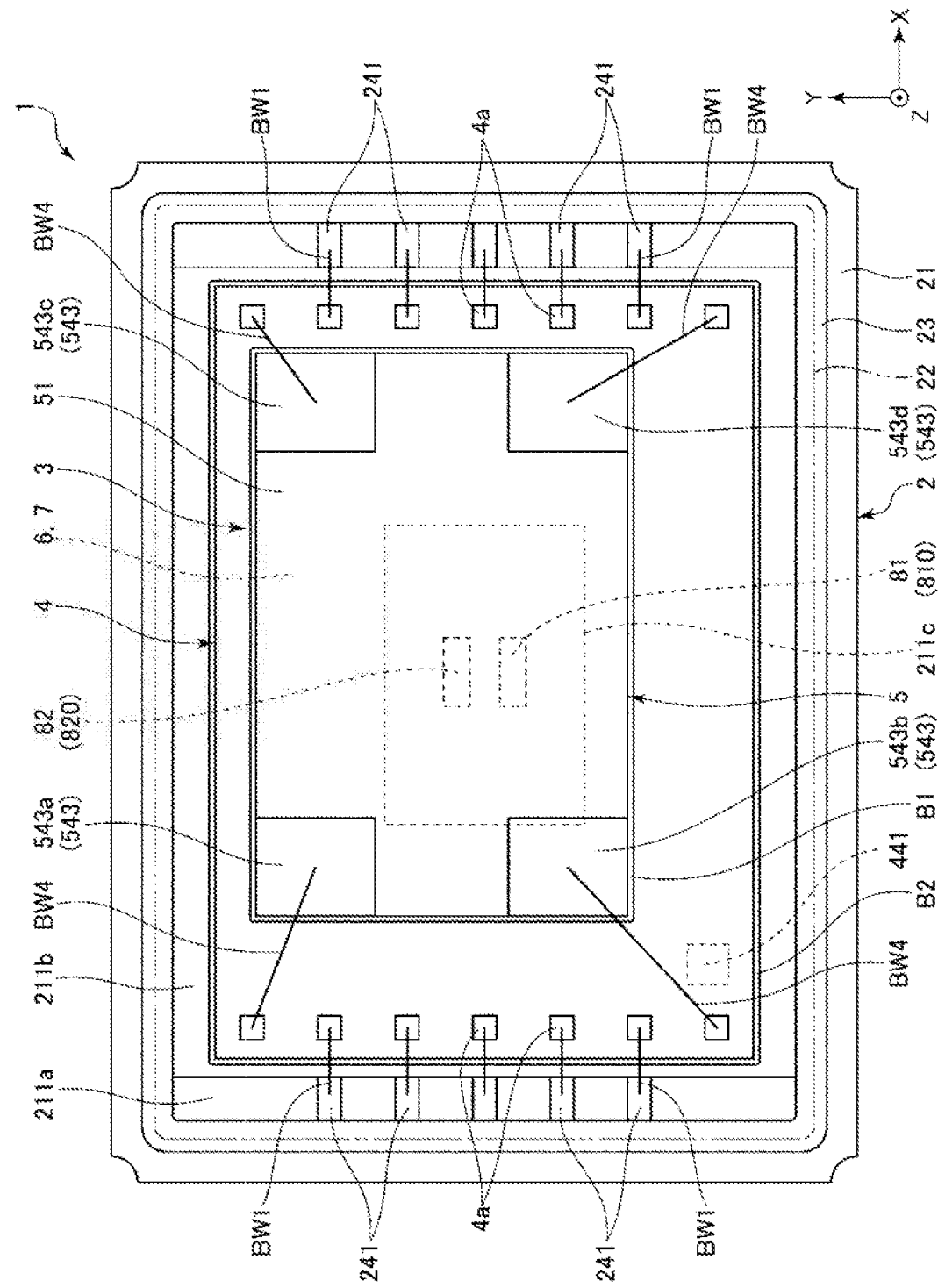
FIG. 2 is a plan view illustrating the oscillator in FIG. 1.
Figure 3:
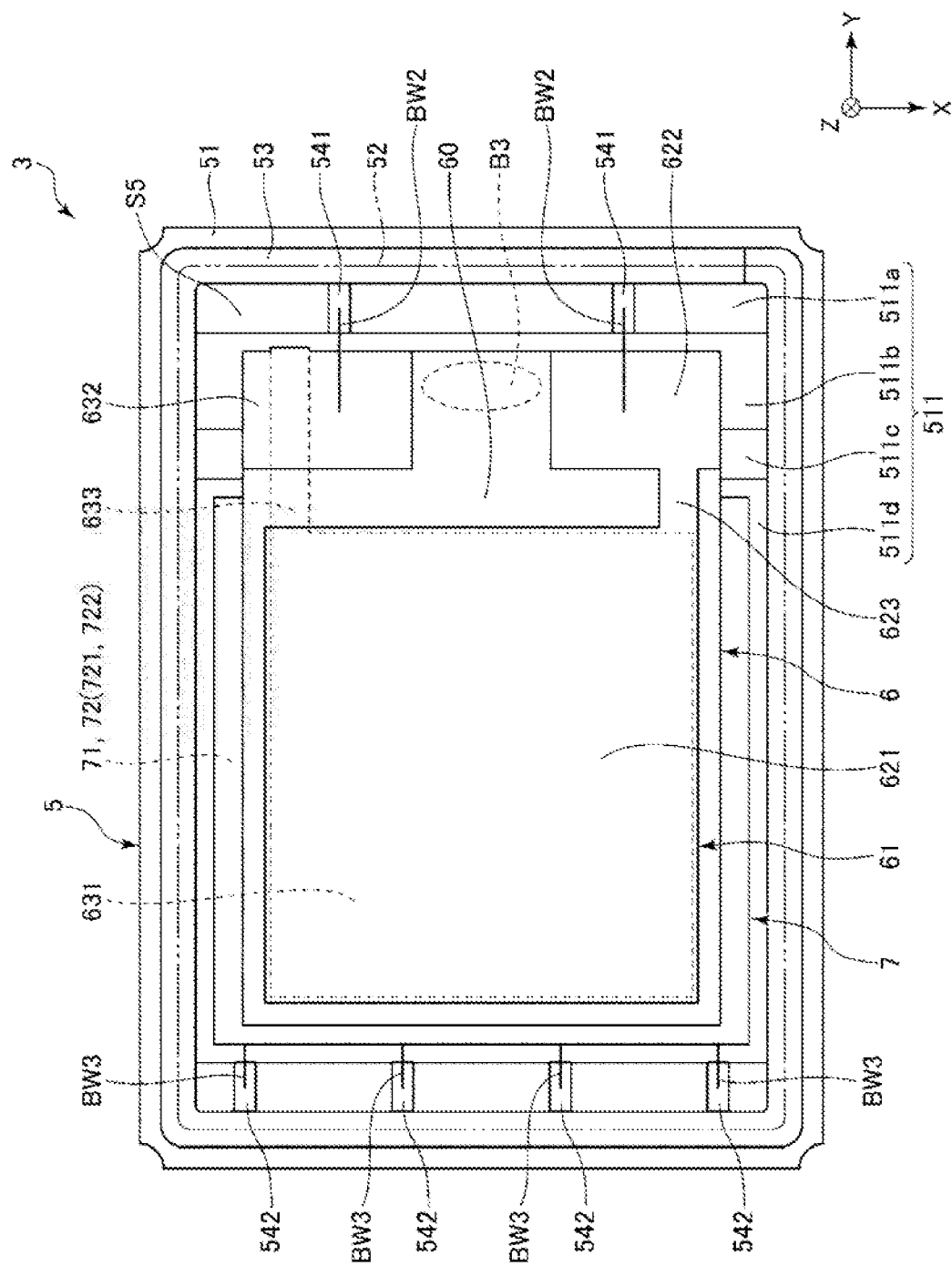
FIG. 3 is a plan view when a temperature compensated crystal oscillator in the oscillator illustrated in FIG. 1 is viewed from a lower side.
Figure 4:
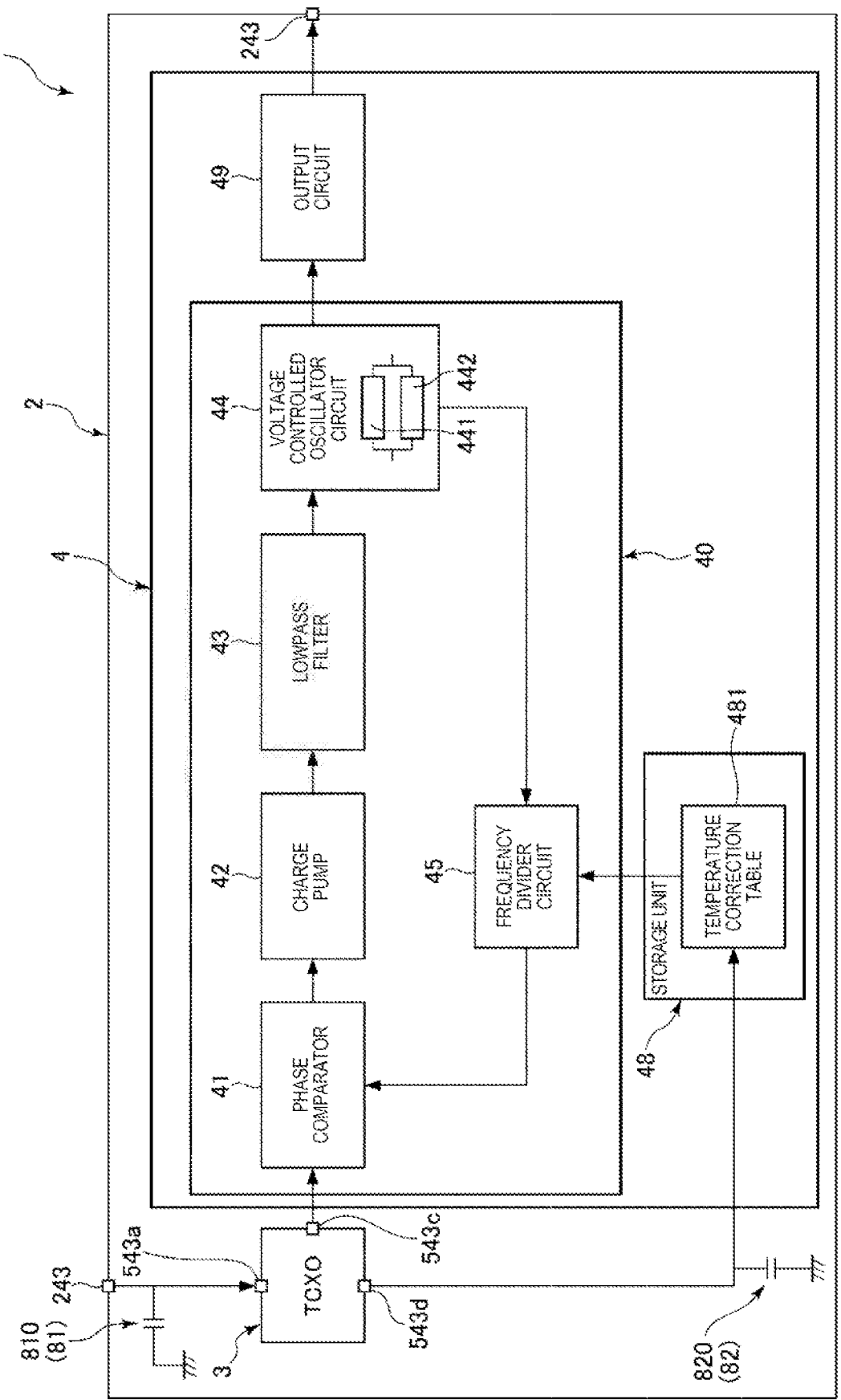
FIG. 4 is a circuit diagram illustrating a second circuit element provided in the oscillator in FIG. 1.

FIG. 1 is a cross-sectional view illustrating an oscillator according to a first embodiment. FIG. 2 is a plan view illustrating the oscillator in FIG. 1. FIG. 3 is a plan view when a temperature compensated crystal oscillator in the oscillator illustrated in FIG. 1 is viewed from a lower side. FIG. 4 is a circuit diagram illustrating a second circuit element provided in the oscillator in FIG. 1. For easy descriptions, in the drawings, an X-axis, a Y-axis, and a Z-axis which are orthogonal to each other are illustrated. In the following descriptions, a positive side in a Z-axis direction is referred to as "up", and a negative side in the Z-axis direction is referred to as "down". The plan view from the Z-axis direction is also simply referred to as "plan view".

As illustrated in FIG. 1, an oscillator 1 includes an outer package 2, a temperature compensated crystal oscillator (TCXO) 3, a second circuit element 4, and discrete components 81 and 82, which are accommodated in the outer package 2. The temperature compensated crystal oscillator 3 includes an inner package 5, a resonator element 6, and a first circuit element 7 which are accommodated in the inner package 5.

The outer package 2 includes a first base substrate 21 and a first lid 22. The first base substrate 21 includes a recess portion 211 opening to an upper surface. The first lid 22 is bonded to the upper surface of the first base substrate 21 through a bonding member 23, so as to close the opening of the recess portion 211. An airtight internal space S2 is formed inside the outer package 2 by the recess portion 211. The temperature compensated crystal oscillator 3 and the first circuit element 7 are accommodated in the internal space S2. Although not particularly limited, the first base substrate 21 may be made of ceramics such as alumina. The first lid 22 may be made of a metal material such as Kovar.

The recess portion 211 is configured by a plurality of recess portions. In the configuration illustrated in FIG. 1, the recess portion 211 includes a recess portion 211a, a recess portion 211b, and a recess portion 211c. The recess portion 211a opens to the upper surface of the first base substrate 21. The recess portion 211b opens to the bottom surface of the recess portion 211a and has an opening smaller than that of the recess portion 211a. The recess portion 211c opens to the bottom surface of the recess portion 211b and has an opening smaller than that of the recess portion 211b. The configuration of the recess portion 211 is not particularly limited.

The second circuit element 4 is mounted on, that is, fixed to the bottom surface of the recess portion 211b through a conductive bonding member B2. The temperature compensated crystal oscillator 3 is mounted on, that is, fixed to the upper surface of the second circuit element 4 through an insulating bonding member B1. That is, the second circuit element 4 and the temperature compensated crystal oscillator 3 are stacked. In other words, the second circuit element 4 and the temperature compensated crystal oscillator 3 are disposed to overlap each other. According to such a configuration, the temperature compensated crystal oscillator 3 is fixed to the first base substrate 21 through the second circuit element 4. Thus, an impact or stress received by the outer package 2, residual stress in the outer package 2, or the like is absorbed by the second circuit element 4 and thus is released. Thus, it is difficult to transfer the impact or the stress to the inner package 5. Therefore, the temperature compensated crystal oscillator 3 drives more stably.

The two discrete components 81 and 82 being single circuit components are fixed to the bottom surface of the recess portion 211c. According to such arrangement, it is possible to arrange the second circuit element 4, the temperature compensated crystal oscillator 3, and each of the discrete components 81 and 82 in the outer package 2 to overlap each other in the Z-axis direction, that is, in a height direction of the oscillator 1. Therefore, it is possible to compactly accommodate the second circuit element 4, the temperature compensated crystal oscillator 3, and each of the discrete components 81 and 82 in the outer package 2, and to reduce the size of the oscillator 1. In particular, since the temperature compensated crystal oscillator 3 is mounted in the second circuit element 4, such a space is substantially not provided. Thus, it is possible to reduce the height of the outer package 2.

In particular, in the first embodiment, as illustrated in FIG. 2, in plan view, the entirety of the discrete components 81 and 82 overlaps the temperature compensated crystal oscillator 3, and the entirety of the temperature compensated crystal oscillator 3 overlaps the second circuit element 4. Thus, it is possible to suppress shifts of the temperature compensated crystal oscillator 3, the second circuit element 4, and each of the discrete components 81 and 82 in an X-axis direction and a Y-axis direction. In addition, it is possible to suppress expansion of the outer package 2 in the X-axis direction and the Y-axis direction and to more reduce the size of the oscillator 1. The embodiment is not limited thereto. In plan view from the Z-axis direction, a portion of the discrete components 81 and 82 may protrude from an outer edge of the temperature compensated crystal oscillator 3 to the outside thereof, and a portion of the temperature compensated crystal oscillator 3 may protrude from an outer edge of the second circuit element 4 to the outside thereof.

As illustrated in FIG. 1, a plurality of internal terminals 241 are disposed on the bottom surface of the recess portion 211a. A plurality of external terminals 243 are disposed on the lower surface of the first base substrate 21. The internal terminals 241 and the external terminal 243 are electrically coupled to each other through a wiring (not illustrated) formed in the first base substrate 21. Each of the plurality of internal terminals 241 is electrically coupled to a terminal 4a of the second circuit element 4 through a bonding wire BW1.

The atmosphere of the internal space S2 is not particularly limited. For example, preferably, the internal space S2 is in a decompressed state where an air is replaced with an inert gas such as nitrogen or argon, and then is decompressed with respect to the atmospheric pressure. In particular, the internal space S2 is preferably in a vacuum state. Thus, an oscillator 1 in which heat insulation of the outer package 2 is improved, and it is difficult to be affected by an external temperature is obtained.

The atmosphere of the internal space S2 is not particularly limited. For example, the internal space S2 may be in an atmospheric pressure state or in a pressurized state. The internal space S2 may be full of an air without replacement with an inert gas such as nitrogen or argon. The internal space S2 may not be airtight and communicate with the outside of the outer package 2.

As illustrated in FIG. 1, the temperature compensated crystal oscillator 3 includes an inner package 5, a resonator element 6, and a first circuit element 7 which are accommodated in the inner package 5. The inner package 5 includes a second base substrate 51 and a second lid 52. The second base substrate 51 includes a recess portion 511 opening to a lower surface. The second lid 52 is bonded to the lower surface of the second base substrate 51 through a bonding member 53, so as to close the opening of the recess portion 511. An internal space S5 which is airtight by the recess portion 511 is formed in the inner package 5. The resonator element 6 and the first circuit element 7 are accommodated in the internal space S5. Although not particularly limited, the second base substrate 51 may be made of ceramics such as alumina. The second lid 52 may be made of a metal material such as Kovar.

The recess portion 511 is configured by a plurality of recess portions. In the configuration illustrated in FIG. 1, the recess portion 511 includes a recess portion 511a, a recess portion 511b, a recess portion 511c, and a recess portion 511d. The recess portion 511a opens to the lower surface of the second base substrate 51. The recess portion 511b opens to the bottom surface of the recess portion 511a and has an opening smaller than that of the recess portion 511a. The recess portion 511c opens to the bottom surface of the recess portion 511b and has an opening smaller than that of the recess portion 511b. The recess portion 511d opens to the bottom surface of the recess portion 511c and has an opening smaller than that of the recess portion 511c. The configuration of the recess portion 511 is not particularly limited.

The resonator element 6 is fixed to the bottom surface of the recess portion 511b. The first circuit element 7 is fixed to the bottom surface of the recess portion 511d. According to such arrangement, it is possible to arrange the resonator element 6 and the first circuit element 7 in the inner package 5 to overlap each other in the Z-axis direction, that is, in the height direction of the oscillator 1. Therefore, it is possible to compactly accommodate the resonator element 6 and the first circuit element 7 in the inner package 5, and thus to reduce the size of the temperature compensated crystal oscillator 3 and to reduce the size of the oscillator 1. The arrangement of the resonator element 6 is not limited to the above description, and the resonator element 6 may be fixed to the lower surface of the first circuit element 7.

A plurality of internal terminals 541 are disposed on the bottom surface of the recess portion 511a. A plurality of internal terminals 542 are disposed on the bottom surface of the recess portion 511c. A plurality of external terminals 543 are disposed on the upper surface of the second base substrate 51. The internal terminals 541 and 542, and the external terminal 543 are electrically coupled to each other through a wiring (not illustrated) formed in the second base substrate 51. Each of the plurality of internal terminals 541 is electrically coupled to the resonator element 6 through a bonding wire BW2. Each of the plurality of internal terminals 542 is electrically coupled to the first circuit element 7 through a bonding wire BW3. Each of the plurality of external terminals 543 is electrically coupled to the second circuit element 4 through a bonding wire BW4. A method for electrically coupling the above components is not particularly limited.

The atmosphere of the internal space S5 is not particularly limited. For example, preferably, the internal space S5 is in a decompressed state where an air is replaced with an inert gas such as nitrogen or argon, and then is decompressed with respect to the atmospheric pressure. In particular, the internal space S5 is preferably in a vacuum state. Thus, viscous resistance decreases and it is possible to resonate the resonator element 6 with high efficiency. The temperature compensated crystal oscillator 3 in which heat insulation of the inner package 5 is improved, and it is difficult to be affected by an external temperature is obtained. The atmosphere of the internal space S5 is not particularly limited. The internal space S5 may be in an atmospheric pressure state or in a pressurized state. Thus, heat transfer by convection is likely to occur in the internal space S5. Accordingly, it is possible to more reduce a temperature difference between the resonator element 6 and a temperature sensor 71 (described later). In addition, accuracy when the temperature sensor 71 detects the temperature of the resonator element 6 is improved. The internal space S5 may be full of an air without replacement with an inert gas such as nitrogen or argon. The internal space S5 may not be airtight, but communicate with the internal space S2.

The resonator element 6 is an AT cut quartz crystal resonator element. The AT cut quartz crystal resonator element has third-order frequency temperature characteristics and thus is excellent in frequency stability. As illustrated in FIG. 3, the resonator element 6 includes a rectangular quartz crystal substrate 60 cut out by AT cut, and an electrode 61 disposed on the surface of the quartz crystal substrate 60. The electrode 61 includes a first excitation electrode 621 and a second excitation electrode 631. The first excitation electrode 621 is disposed on the lower surface of the quartz crystal substrate 60. The second excitation electrode 631 is disposed on the upper surface of the quartz crystal substrate 60 and faces the first excitation electrode 621 with the quartz crystal substrate 60 interposed between the excitation electrodes. The electrode 61 includes a first pad electrode 622, a second pad electrode 632, a first lead electrode 623, and a second lead electrode 633. The first pad electrode 622 and the second pad electrode 632 are arranged side by side at an edge portion of the lower surface of the quartz crystal substrate 60. The first lead electrode 623 electrically couples the first excitation electrode 621 and the first pad electrode 622 to each other. The second lead electrode 633 electrically couples the second excitation electrode 631 and the second pad electrode 632 to each other.

One end portion of such a resonator element 6 is bonded to the bottom surface of the recess portion 511b through a bonding member B3. Each of the first pad electrode 622 and the second pad electrode 632 is electrically coupled to the internal terminal 541 through the bonding wire BW2. The first pad electrode 622 and the second pad electrode 632 may be electrically coupled to the inner package 5 through a conductive adhesive instead of the bonding wire. The bonding member B3 is not particularly limited. As the bonding member B3, for example, a conductive bonding member represented by a metal bump, solder, a brazing material, a metal paste, or a conductive resin adhesive may be provided, or an insulating bonding member represented by various resin adhesives of epoxy series, silicone series, or polyimide series may be provided. The bonding member B3 is preferably the conductive bonding member.

The conductive bonding member contains a metal material. Thus, the conductive bonding member has a thermal conductivity higher than that of an insulating bonding member which is represented by a resin adhesive and does not contain a metal material. Therefore, the resonator element 6 and the first circuit element 7 are easily thermally joined to each other through the bonding member B3 and the second base substrate 51, and thus it is possible to more reduce the temperature difference between the resonator element 6 and the first circuit element 7. Thus, it is possible to detect the temperature of the resonator element 6 by the temperature sensor 71 with high accuracy.

The configuration of the resonator element 6 is not particularly limited. For example, the shape of the quartz crystal substrate 60 in plan view is not limited to a rectangle. In addition to the AT cut quartz crystal resonator element, a SC cut quartz crystal resonator element, a BT cut quartz crystal resonator element, a tuning fork type resonator element, a surface acoustic wave resonator, other piezoelectric resonator elements, a micro-electromechanical system (MEMS) resonator element, and the like may be used as the resonator element 6.

Instead of the quartz crystal substrate, for example, various piezoelectric substrates made of lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium niobate ((K, Na)$NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$) may be used. For example, a substrate such as a silicon substrate other than the piezoelectric substrate may be used.

As illustrated in FIGS. 1 and 3, the first circuit element 7 includes the temperature sensor 71 and the oscillation circuit 72. The oscillation circuit 72 has a function to causes the resonator element 6 to oscillate and to generate an oscillation signal subjected to temperature compensation based on the detected temperature of the temperature sensor 71. That is, the oscillation circuit 72 includes an oscillation circuit unit 721 and a temperature compensation circuit unit 722. The oscillation circuit unit 721 is electrically coupled to the resonator element 6, amplifies an output signal of the resonator element 6, and feeds the amplified signal back to the resonator element 6, and thereby causes the resonator element 6 to oscillate. The temperature compensation circuit unit 722 performs temperature compensation based on temperature information output from the temperature sensor 71 such that frequency fluctuation of the output signal occurs smaller than the frequency temperature characteristics of the resonator element 6 itself. As the oscillation circuit 72, for example, an oscillation circuit such as a Pierce oscillation circuit, an inverter type oscillation circuit, a Colpitts oscillation circuit, and a Hartley oscillation circuit may be used. For example, the temperature compensation circuit unit 722 in the oscillation circuit 72 may adjust the capacitance of a variable capacitance circuit coupled to the oscillation circuit unit 721 to adjust an oscillation frequency of the oscillation circuit unit 721. The frequency of the output signal of the oscillation circuit unit 721 may be adjusted by a PLL circuit or a direct digital synthesizer circuit.

As described above, the temperature sensor 71 and the resonator element 6 are accommodated together in the inner package 5, and thus it is possible to dispose the temperature sensor 71 in the same space as that for the resonator element 6 and near the resonator element 6. Therefore, it is possible to detect the temperature of the resonator element 6 by the temperature sensor 71 with higher accuracy, and thus temperature compensation by the oscillation circuit 72 becomes more accurate.

In the embodiment, the temperature sensor 71 is configured by an IC temperature sensor and is mounted in the first circuit element 7. However, the embodiment is not limited thereto. That is, the temperature sensor 71 may be a discrete component which is provided to be separate from the first circuit element 7. Because of the discrete component, it is possible to increase the degree of freedom for disposing the temperature sensor 71 and to dispose the temperature sensor 71 closer to the resonator element 6. In this case, the temperature sensor 71 may be configured with a thermistor or a thermocouple, for example. For example, the temperature sensor 71 may be disposed on the lower surface of the second base substrate 51 or the first circuit element 7.

The temperature compensated crystal oscillator 3 is described above. The temperature compensated crystal oscillator 3 includes four external terminals 543 described above. As illustrated in FIG. 3, among the external terminals, one external is a terminal 543a for a power supply voltage to be supplied to the first circuit element 7. One terminal is a ground terminal 543b for the power supply voltage. One terminal is a terminal 543c for an oscillation signal output from the oscillation circuit 72. One terminal is a terminal 543d for an output signal of the temperature sensor 71. The number of external terminals 543 or the purpose thereof is not particularly limited.

As illustrated in FIG. 1, the temperature compensated crystal oscillator 3 is disposed at a posture at which the second lid 52 is directed toward the bottom surface of the recess portion 211b, in the internal space S2. The lower surface of the second lid 52 is bonded to the upper surface of the second circuit element 4 through the insulating bonding member B1. Although not particularly limited, for example, various resin adhesives of an epoxy type, a polyimide type, a silicone type, and the like may be used for the insulating bonding member B1. If a conductive bonding member is used for fixing the second circuit element 4 and the temperature compensated crystal oscillator 3 to each other, the conductive bonding member comes into contact with a plurality of terminals 4a disposed on the upper surface of the second circuit element 4, and a short circuit may occur between the terminals 4a. However, if the insulating bonding member B1 is used, such a problem does not occur. Thus, the temperature compensated crystal oscillator 3 is easily fixed to the upper surface of the second circuit element 4.

The insulating bonding member B1 has a thermal conductivity lower than a thermal conductivity of a metal-based conductive bonding member which is represented by solder, a metal paste, or the like. Thus, it is difficult to transfer heat of the second circuit element 4 to the inner package 5 through the insulating bonding member B1. Therefore, it is possible to effectively suppress an occurrence of a situation in which the temperatures of the resonator element 6 and the first circuit element 7 in the inner package 5 increase excessively, or a temperature difference between the resonator element 6 and the temperature sensor 71 increases. As a result, it is possible to detect the temperature of the resonator element 6 by the temperature sensor 71 with higher accuracy, and thus temperature compensation by the oscillation circuit 72 is performed more accurately. Accordingly, the oscillator 1 capable of outputting a frequency signal having high accuracy is obtained.

As illustrated in FIG. 1, the second circuit element 4 is disposed in the internal space S2 and is bonded to the bottom surface of the recess portion 211b through the conductive bonding member B2. The conductive bonding member B2 is not particularly limited. For example, a metal bump, solder, a brazing material, a metal paste, and a conductive resin adhesive may be used as the conductive bonding member B2.

Since such a conductive bonding member B2 contains a metal material, the conductive bonding member B2 has a thermal conductivity higher than the thermal conductivity of the insulating bonding member which is represented by a resin adhesive and does not contain the metal material. Thus, it is easy to transfer heat of the second circuit element 4 to the outer package 2 through the conductive bonding member B2. Therefore, the heat of the second circuit element 4 is easily emitted from the outer package 2 to the outside thereof, and thus it is possible to suppress an excessive increase of the temperature of the second circuit element 4 or heat accumulation in the internal space S2. Since the second circuit element 4 has a high heat dissipation property, it is difficult to transfer the heat of the second circuit element 4 to the inner package 5. Thus, it is possible to more effectively suppress the occurrence of the above-described situation in which the temperatures of the resonator element 6 and the first circuit element 7 increase excessively, or a temperature difference between the resonator element 6 and the temperature sensor 71 increases. As a result, it is possible to detect the temperature of the resonator element 6 by the temperature sensor 71 with higher accuracy, and thus temperature compensation by the oscillation circuit 72 becomes more accurate. Accordingly, the oscillator 1 capable of outputting a frequency signal having high accuracy is obtained.

As described above, as illustrated in FIG. 4, the second circuit element 4 includes a decimal frequency division type PLL circuit (phase synchronization circuit) 40, a storage unit 48, and an output circuit 49. The PLL circuit 40 functions as a frequency control circuit that controls the frequency of the oscillation signal output from the oscillation circuit 72 and further corrects frequency temperature characteristics remaining in the oscillation signal output by the temperature compensated crystal oscillator 3. The storage unit 48 stores a temperature correction table 481. In the embodiment, the PLL circuit 40, the storage unit 48, and the output circuit 49 are configured as a one-chip circuit element. However, the PLL circuit 40, the storage unit 48, and the output circuit 49 may be configured by a plurality of chip circuit elements, or some thereof may be configured by discrete components.

The PLL circuit 40 includes a phase comparator 41, a charge pump 42, a lowpass filter 43, a voltage controlled oscillator circuit 44, and a frequency divider circuit 45. The phase comparator 41 compares the phase of an oscillation signal output by the oscillation circuit 72 to the phase of a clock signal output by the frequency divider circuit 45, and outputs a comparison result in a form of a pulse voltage. The charge pump 42 converts the pulse voltage output by the phase comparator 41 into a current. The lowpass filter 43 smoothens the current output by the charge pump 42 and converts the current into a voltage.

The voltage controlled oscillator circuit 44 sets an output voltage of the lowpass filter 43 to a control voltage and outputs a signal having a frequency changing in accordance with the control voltage. In the embodiment, the voltage controlled oscillator circuit 44 is an LC oscillation circuit configured using an inductor 441 such as a coil and a capacitance element 442 such as a capacitor. However, the embodiment is not limited thereto, and an oscillation circuit using a piezoelectric resonator such as a quartz crystal resonator may be used. The frequency divider circuit 45 outputs a clock signal obtained by performing decimal frequency division of a clock signal output by the voltage controlled oscillator circuit 44 at a division ratio determined from the output signal of the temperature sensor 71 and the temperature correction table 481. The division ratio of the frequency divider circuit 45 is not limited to a configuration in which the division ratio is determined by the temperature correction table 481. For example, the division ratio may be determined by a polynomial operation, or may be determined by a neural network operation based on a learned model obtained by performing machine learning.

Here, as illustrated in FIG. 2, the inductor 441 in the voltage controlled oscillator circuit 44 does not overlap the inner package 5, that is, the temperature compensated crystal oscillator 3 in plan view. Thus, the inductor 441 does not overlap the second lid 52 being a metal member of the temperature compensated crystal oscillator 3, the bonding member 53, and the electrode 61 of the resonator element 6. Therefore, due to the metal member of the temperature compensated crystal oscillator 3, in particular, the second lid 52 being a planar metal member facing the second circuit element 4 and the electrode 61, a magnetic field generated by a current flowing in the inductor 441 is hardly blocked. Thus, it is difficult to generate an eddy current in the metal member. As a result, the deterioration of the Q value of the inductor 441 is reduced. The embodiment is not limited thereto. At least a portion of the inductor 441 may overlap the temperature compensated crystal oscillator 3 in plan view.

The clock signal output by the PLL circuit 40 is input to the output circuit 49, and the output circuit 49 generates an oscillation signal having amplitude which is adjusted to a desired level. The oscillation signal generated by the output circuit 49 is output to the outside of the oscillator 1 through the external terminal 243 of the oscillator 1.

As described above, since the frequency temperature characteristics remaining in the oscillation signal output by the temperature compensated crystal oscillator 3 are further corrected by the PLL circuit 40, an oscillator 1 in which frequency deviation occurring by the temperature is smaller is obtained. The PLL circuit 40 is not particularly limited. For example, the PLL circuit 40 may include an integer frequency division type PLL circuit that is disposed between the oscillation circuit 72 and the phase comparator 41 and divides the oscillation signal output by the oscillation circuit 72 at an integer division ratio. The PLL circuit 40 is not limited to a component that further performs temperature compensation on the output signal of the temperature compensated crystal oscillator 3. For example, in order to obtain a desired frequency signal, a configuration in which the PLL circuit 40 multiplies an output frequency of the temperature compensated crystal oscillator 3 by a fixed value may be made.

As described above, the discrete components 81 and 82 are accommodated in the outer package 2 and are bonded to the bottom surface of the recess portion 211c. The discrete components 81 and 82 correspond to bypass capacitors 810 and 820, respectively. As illustrated in FIG. 4, the bypass capacitor 810 is coupled to the terminal 543a between the external terminal 243 provided in the outer package 2 and the terminal 543a for the power supply voltage, which is provided in the inner package 5. Thus, it is possible to remove noise from the power supply voltage supplied through the external terminal 243 and to supply the stable power supply voltage to the first circuit element 7.

The bypass capacitor 820 is coupled to the terminal 543d between the terminal 543d for the output signal of the temperature sensor 71 and the PLL circuit 40. Thus, it is possible to remove noise from the output signal of the temperature sensor 71 and to supply the more accurate output signal to the PLL circuit 40. Therefore, it is possible to determine the division ratio by the frequency divider circuit 45 with higher accuracy. The discrete components 81 and 82 are not limited to the bypass capacitors 810 and 820. For example, thermistors, resistors, or diodes may be provided. At least one of the discrete components 81 and 82 may be omitted, and another discrete component may be added. The bypass capacitors 810 and 820 may be mounted in the second circuit element 4.

The oscillator 1 is described above. As described above, the oscillator 1 includes the outer package 2 as the first container, the inner package 5 as the second container, which is accommodated in the outer package 2, the resonator element 6 accommodated in the inner package 5, the temperature sensor 71 accommodated in the inner package 5, the first circuit element 7 which is accommodated in the inner package 5 and includes the oscillation circuit 72 that causes the resonator element 6 to oscillate so as to generate an oscillation signal of which a temperature is compensated based on the detected temperature of the temperature sensor 71, and the second circuit element 4 which is accommodated in the outer package 2 and includes the PLL circuit 40 as the frequency control circuit, that controls the frequency of the oscillation signal output by the oscillation circuit 72. The inner package 5 and the second circuit element 4 are stacked.

According to such a configuration, since the temperature sensor 71 and the resonator element 6 are accommodated together in the inner package 5, it is possible to dispose the temperature sensor 71 in the same space as that for the resonator element 6 and near the resonator element 6. Therefore, it is possible to detect the temperature of the resonator element 6 by the temperature sensor 71 with higher accuracy, and thus temperature compensation by the oscillation circuit 72 becomes more accurate. Accordingly, the oscillator 1 capable of outputting a frequency signal having high accuracy is obtained. Since the inner package 5 and the second circuit element 4 are stacked in the Z-axis direction, a space is not provided between the inner package 5 and the second circuit element 4. Thus, it is possible to reduce the height of the outer package 2 and to reduce expansion of the outer package 2 in the X-axis direction and the Y-axis direction. Accordingly, it is possible to reduce the size of the oscillator 1.

As described above, the outer package 2 includes the first base substrate 21 and the first lid 22 bonded to the first base substrate 21, and has the internal space S2 in which the inner package 5 and the second circuit element 4 are accommodated. The second circuit element 4 is mounted on the first base substrate 21, and the inner package 5 is mounted on the second circuit element 4. According to such a configuration, the inner package 5 is fixed to the first base substrate 21 through the second circuit element 4. Thus, an impact or stress received by the outer package 2 is absorbed by the second circuit element 4 and is released. Thus, it is difficult to transfer the impact or the stress to the inner package 5. Therefore, the temperature compensated crystal oscillator 3 drives more stably.

As described above, the inner package 5 is bonded to the second circuit element 4 through the insulating bonding member B1, and the second circuit element 4 is bonded to the first base substrate 21 through the conductive bonding member B2. The insulating bonding member B1 has a thermal conductivity lower than a thermal conductivity of a metal-based conductive bonding member which is represented by solder, a metal paste, or the like. Thus, it is difficult to transfer heat of the second circuit element 4 to the inner package 5 through the insulating bonding member B1. Therefore, it is possible to effectively suppress an occurrence of a situation in which the temperatures of the resonator element 6 and the first circuit element 7 in the inner package 5 increase excessively, or a temperature difference between the resonator element 6 and the temperature sensor 71 increases. Since the conductive bonding member B2 contains a metal material, the conductive bonding member B2 has a thermal conductivity higher than the thermal conductivity of the insulating bonding member which is represented by a resin adhesive and does not contain the metal material. Thus, it is easy to transfer heat of the second circuit element 4 to the outer package 2 through the conductive bonding member B2. Therefore, the heat of the second circuit element 4 is easily emitted from the outer package 2 to the outside thereof, and thus it is possible to suppress an excessive increase of the temperature of the second circuit element 4 or heat accumulation in the internal space S2. Since the second circuit element 4 has a high heat dissipation property, it is difficult to transfer the heat of the second circuit element 4 to the inner package 5. Thus, it is possible to more effectively suppress the occurrence of the above-described situation in which the temperatures of the resonator element 6 and the first circuit element 7 increase excessively, or a temperature difference between the resonator element 6 and the temperature sensor 71 increases. As a result, it is possible to detect the temperature of the resonator element 6 by the temperature sensor 71 with higher accuracy, and thus temperature compensation by the oscillation circuit 72 becomes more accurate. Accordingly, the oscillator 1 capable of outputting a frequency signal having high accuracy is obtained.

As described above, the inner package 5 includes the terminal 543*d* as a temperature output terminal, from which the output voltage of the temperature sensor 71 is output. The terminal 543*d* is electrically coupled to the PLL circuit 40. Thus, it is possible to control the division ratio of the PLL circuit 40 based on a value measured by the temperature sensor 71. Therefore, even though measurement absolute accuracy of the temperature sensor 71 is low, it is possible to output an oscillation signal which has corrected frequency temperature characteristics and has small frequency deviation, so long as a correspondence relation between the actual temperature and the value obtained by measuring the temperature does not fluctuate. Accordingly, the oscillator 1 in which the frequency deviation by the temperature occurs small is obtained.

As described above, the PLL circuit 40 includes the inductor 441. In plan view, the inner package 5 does not overlap the inductor 441. Thus, the inductor 441 does not overlap the inner package 5 or a metal member of an element accommodated in the inner package 5. In the embodiment, the inductor 441 does not overlap the second lid 52, the bonding member 53, and the electrode 61 of the resonator element 6. Therefore, due to the metal member, the magnetic field generated by a current flowing in the inductor 441 is hardly blocked. Thus, it is difficult to generate an eddy current in the metal member. As a result, the deterioration of the Q value of the inductor 441 is reduced.

As described above, the inner package 5 includes the terminal 543*a* as a power supply terminal, to which the power supply voltage to be supplied to the oscillation circuit 72 is applied. The oscillator 1 is accommodated in the outer package 2 and includes a bypass capacitor 810 coupled to the terminal 543*a*. Thus, it is possible to remove noise by the bypass capacitor 810 and to supply the stable power supply voltage to the oscillation circuit 72.

Second Embodiment

Figure 5:
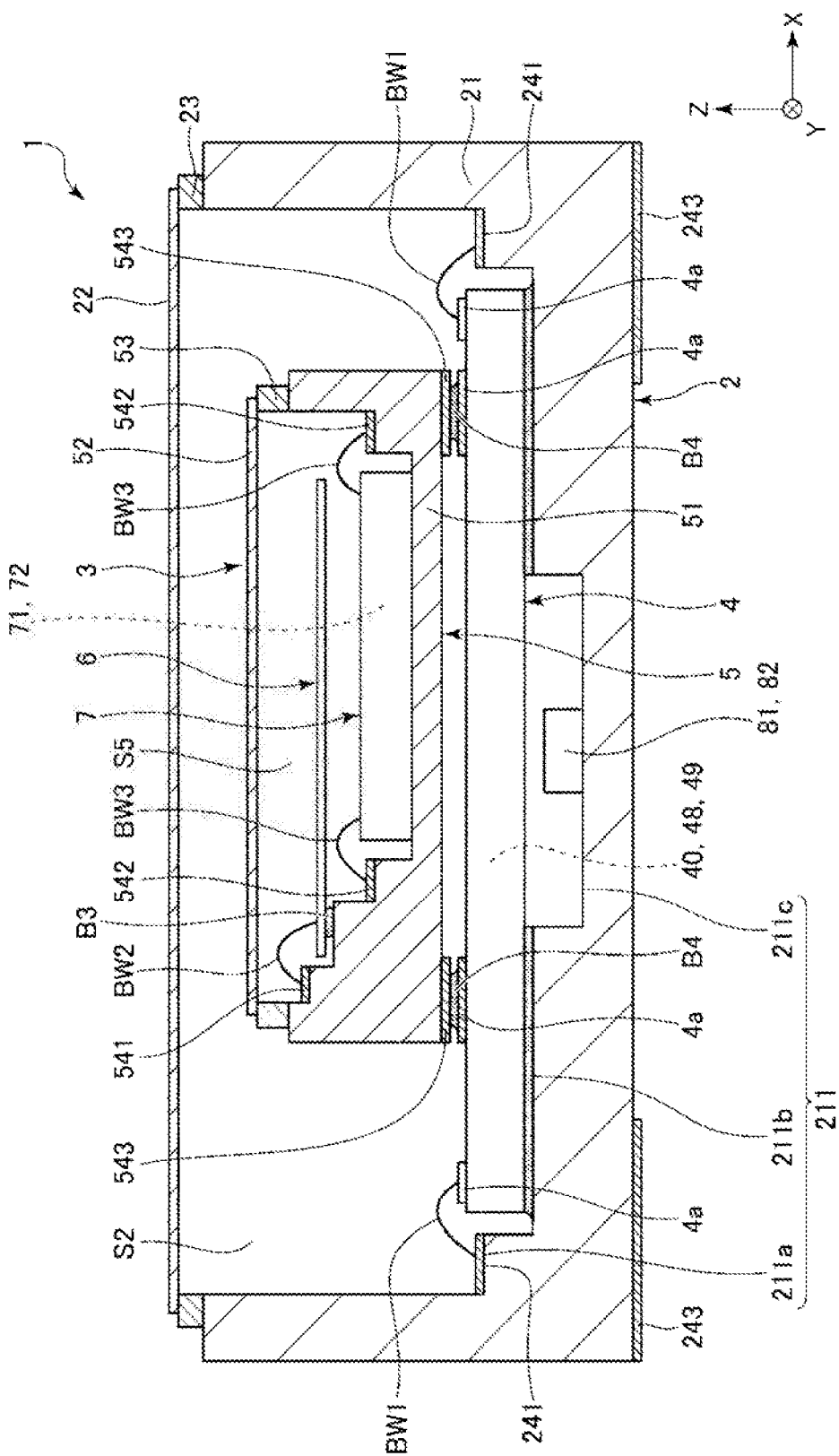
FIG. 5 is a cross-sectional view illustrating an oscillator according to a second embodiment.

FIG. 5 is a cross-sectional view illustrating an oscillator according to a second embodiment.

The second embodiment is similar to the above-described first embodiment except that the posture of the temperature compensated crystal oscillator 3 is reversed vertically. In the following descriptions, descriptions for the second embodiment will be made focusing on a difference from the above-described embodiment, and descriptions of the similar items will not be repeated. In FIG. 5, components similar to those in the above-described embodiment are denoted by the same reference signs.

As illustrated in FIG. 5, in the oscillator 1 in the second embodiment, the posture of the temperature compensated crystal oscillator 3 is vertically reversed with respect to the above-described first embodiment. That is, the temperature compensated crystal oscillator 3 is accommodated in the internal space S2 at a posture in which the second base substrate 51 is directed toward the second circuit element 4. The second base substrate 51 is bonded to the upper surface of the second circuit element 4 through a conductive bonding member B4 and is electrically coupled to the terminal 4a. The conductive bonding member B4 is configured with a metal bump such as a solder bump. The temperature compensated crystal oscillator 3 may be mounted on the second circuit element 4 by flip chip mounting, for example. According to such a configuration, since the bonding wire is not used for electrical coupling between the second circuit element 4 and the temperature compensated crystal oscillator 3, it is not necessary to ensure the loop height of the bonding wire. Thus, it is possible to reduce the height of the outer package 2 in comparison to the above-described first embodiment.

With such a second embodiment, it is also possible to exhibit effects similar to the above-described first embodiment.

Third Embodiment

Figure 6:
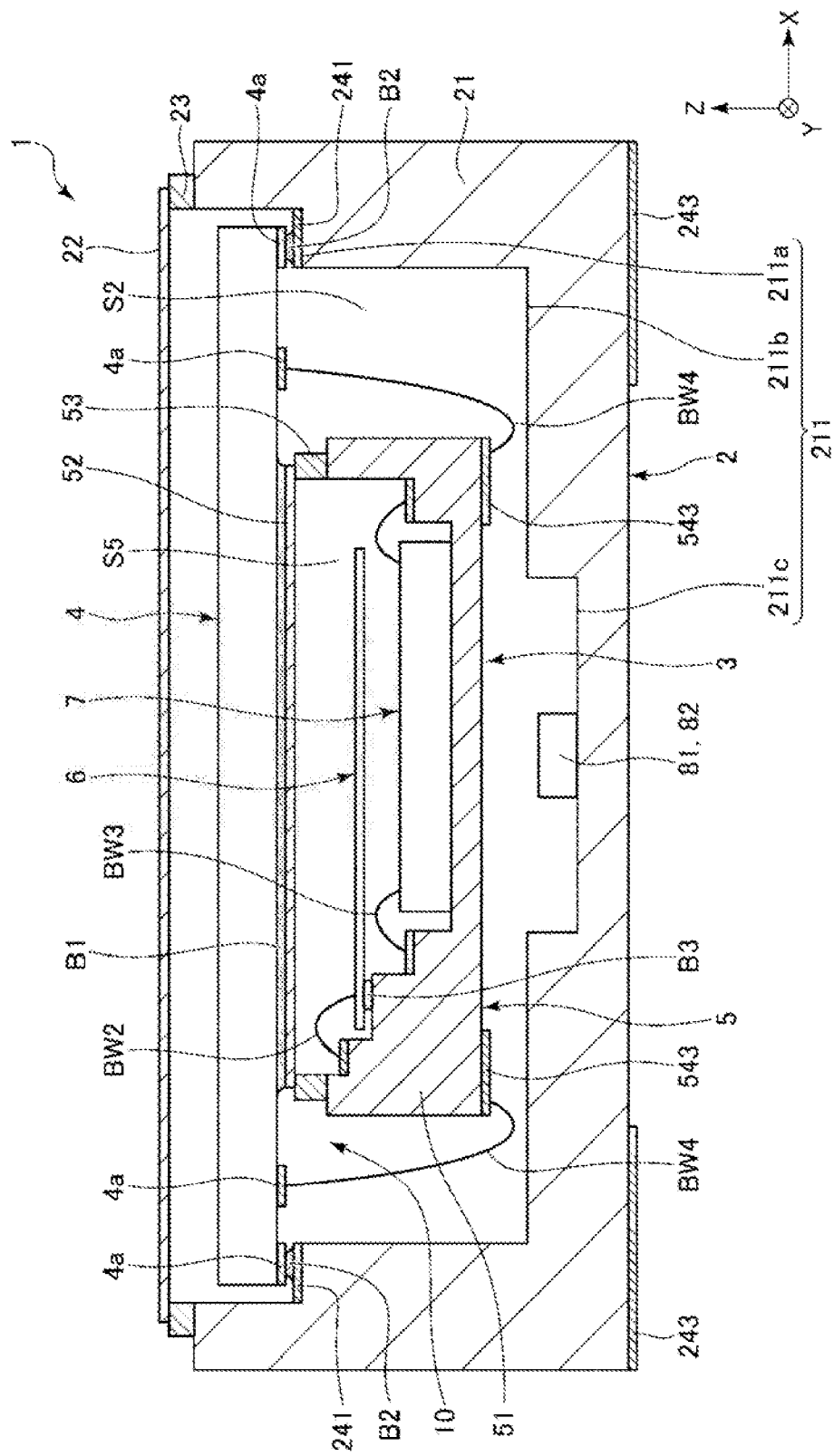
FIG. 6 is a cross-sectional view illustrating an oscillator according to a third embodiment.

FIG. 6 is a cross-sectional view illustrating an oscillator according to a third embodiment.

The third embodiment is similar to the above-described first embodiment except that the posture of a stacked body 10 configured by the temperature compensated crystal oscillator 3 and the second circuit element 4 is vertically reversed. In the following descriptions, descriptions for the third embodiment will be made focusing on a difference from the above-described embodiment, and descriptions of the similar items will not be repeated. In FIG. 5, components similar to those in the above-described embodiment are denoted by the same reference signs.

As illustrated in FIG. 6, in the oscillator 1 in the third embodiment, the posture of the stacked body 10 configured by the temperature compensated crystal oscillator 3 and the second circuit element 4 is vertically reversed with respect to the above-described first embodiment. That is, the temperature compensated crystal oscillator 3 is located below the second circuit element 4, and the temperature compensated crystal oscillator 3 is suspended from the second circuit element 4. In the embodiment, the terminal 4a of the second circuit element 4 is directed downward. Thus, the terminal 4a and the internal terminal 241 are electrically coupled to each other through the conductive bonding member B2 which causes the second circuit element 4 to be fixed to the bottom surface of the recess portion 211a.

With such a third embodiment, it is also possible to exhibit the effects similar to those in the above-described first embodiment.

Fourth Embodiment

Figure 7:
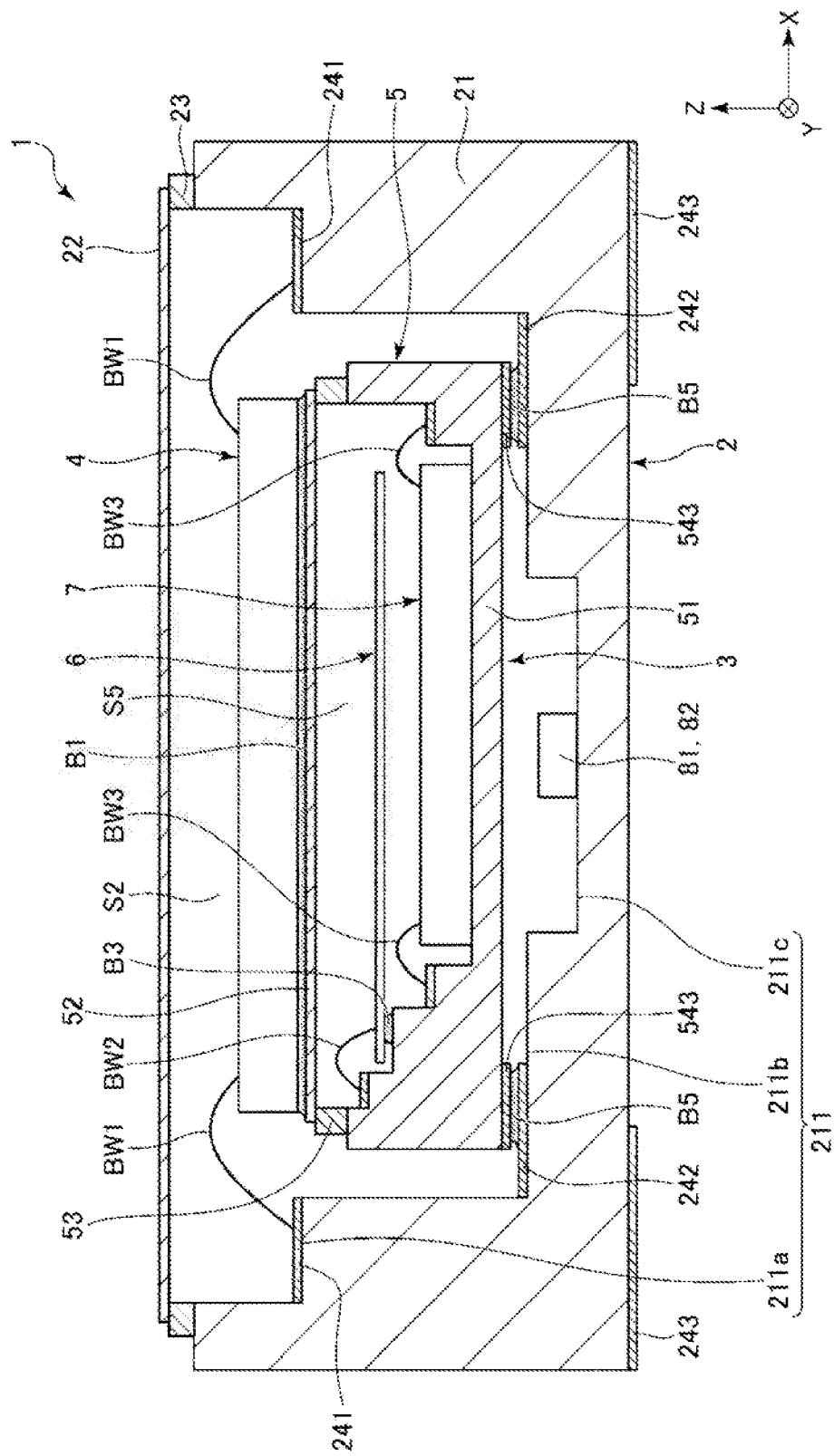
FIG. 7 is a cross-sectional view illustrating an oscillator according to a fourth embodiment.

FIG. 7 is a cross-sectional view illustrating an oscillator according to a fourth embodiment.

The fourth embodiment is similar to the above-described first embodiment except that the arrangement of the temperature compensated crystal oscillator 3 and the second circuit element 4 is reversed. In the following descriptions, descriptions for the fourth embodiment will be made focusing on a difference from the above-described embodiment, and descriptions of the similar items will not be repeated. In FIG. 7, components similar to those in the above-described embodiment are denoted by the same reference signs.

As illustrated in FIG. 7, in the oscillator 1 in the fourth embodiment, the plurality of internal terminals 241 is disposed on the bottom surface of the recess portion 211a, and the plurality of internal terminals 242 is disposed on the bottom surface of the recess portion 211b. The internal terminals 241 and 242, and the external terminal 243 are electrically coupled to each other through a wiring (not illustrated) formed in the first base substrate 21.

The temperature compensated crystal oscillator 3 is accommodated in the outer package 2 at a posture of being vertically reversed with respect to the above-described first embodiment. That is, in the temperature compensated crystal oscillator 3, the second base substrate 51 is located below the second lid 52. The temperature compensated crystal oscillator 3 is bonded to the bottom surface of the recess portion 211b through a conductive bonding member B5, and the external terminal 543 and the internal terminal 242 are electrically coupled to each other through the conductive bonding member B5. The second circuit element 4 is bonded to the upper surface of the temperature compensated crystal oscillator 3, that is, to the second lid 52 through the insulating bonding member B1, and is electrically coupled to the internal terminal 241 through the bonding wire BW1.

With such a fourth embodiment, it is also possible to exhibit the effects similar to those in the above-described first embodiment.

Fifth Embodiment

Figure 8:
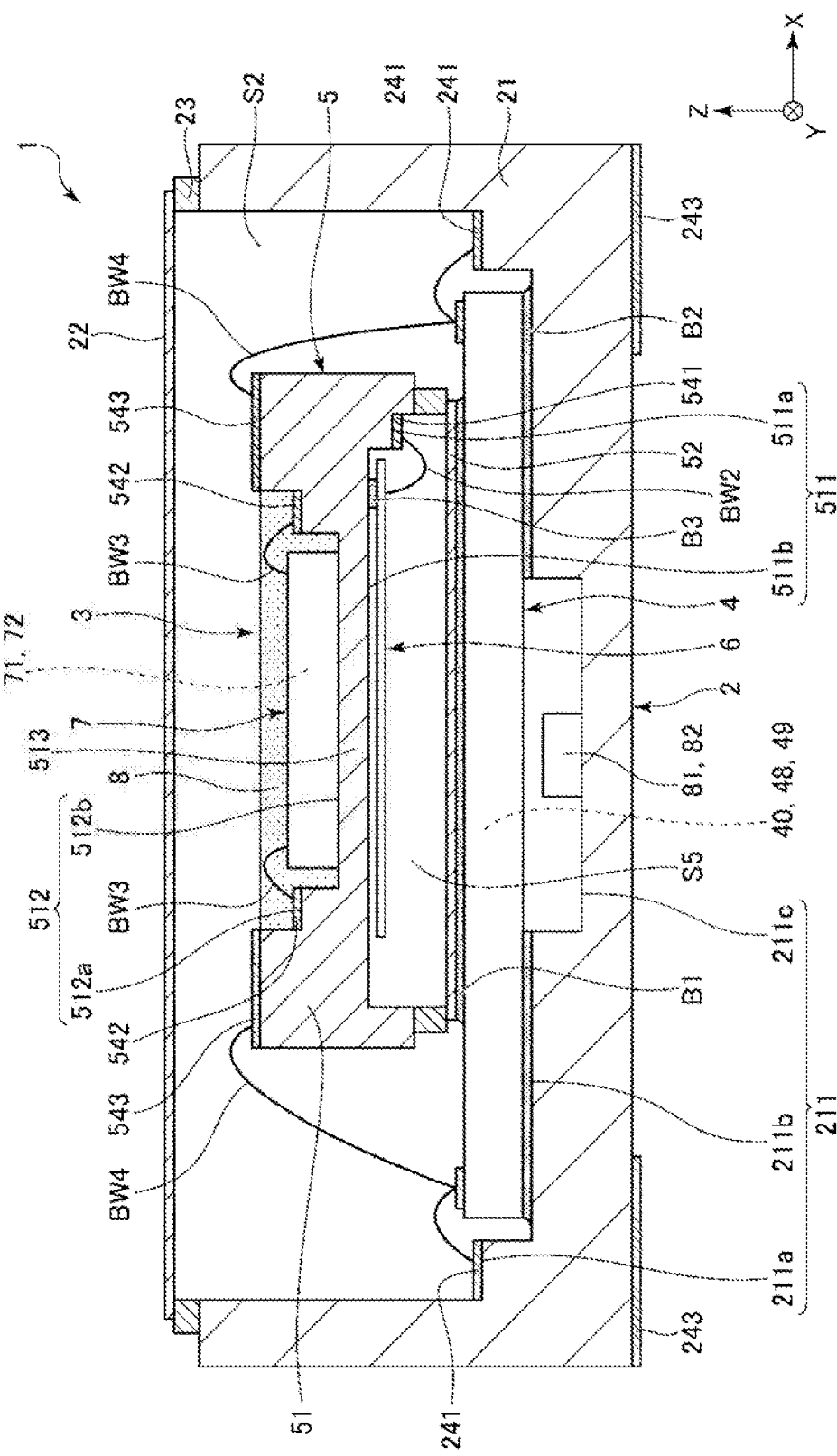
FIG. 8 is a cross-sectional view illustrating an oscillator according to a fifth embodiment.

FIG. 8 is a cross-sectional view illustrating an oscillator according to a fifth embodiment.

The fifth embodiment is similar to the above-described first embodiment except that the configuration of the temperature compensated crystal oscillator 3 is different. In the following descriptions, descriptions for the fifth embodiment will be made focusing on a difference from the above-described embodiment, and descriptions of the similar items will not be repeated. In FIG. 8, components similar to those in the above-described embodiment are denoted by the same reference signs.

As illustrated in FIG. 8, in the oscillator 1 in the fifth embodiment, the first circuit element 7 is disposed outside the inner package 5, that is, outside the internal space S5. Specific descriptions will be made below.

The second base substrate 51 includes the recess portion 512 opening to the upper surface thereof. The recess portion 512 includes the plurality of recess portions. In the configuration in FIG. 8, the recess portion 512 includes the recess portion 512a opening to the upper surface of the second base substrate 51 and the recess portion 512b which opens to the bottom surface of the recess portion 512a and has an opening smaller than the recess portion 512a. The second circuit element 4 is fixed to the bottom surface of the recess portion 512b. The plurality of internal terminals 542 are provided on the bottom surface of the recess portion 512a. The internal terminals 542 and the first circuit element 7 are electrically coupled to each other through the bonding wire BW3. A molding material 8 for molding the first circuit element 7 is disposed at the recess portion 512. The molding material 8 will be omitted.

The recess portion 511 includes the recess portion 511*a* opening to the lower surface of the second base substrate 51, and the recess portion 511*b* which opens to the bottom surface of the recess portion 511*a* and has an opening smaller than the recess portion 511*a*. The resonator element 6 is fixed to the bottom surface of the recess portion 511*b* through the bonding member B3. The plurality of internal terminals 541 are disposed on the bottom surface of the recess portion 511*a*. The resonator element 6 and the plurality of internal terminals 541 are electrically coupled to each other through the bonding wire BW2.

As described above, the resonator element 6 and the first circuit element 7 are disposed with a portion 513 interposed between the recess portion 511 and the recess portion 512 of the second base substrate 51. Thus, the resonator element 6 and the first circuit element 7 are thermally combined through the portion 513, and the temperature difference between the resonator element 6 and the temperature sensor 71 in the first circuit element 7 becomes smaller. Therefore, the oscillator 1 capable of outputting a frequency signal having high accuracy is obtained.

As described above, the oscillator 1 in the fifth embodiment includes the outer package 2 as the first container, the inner package 5 as the second container, which is accommodated in the outer package 2, includes the second base substrate 51 as the base substrate and the second lid 52 as the lid, which is bonded to the lower surface (one main surface) of the second base substrate 51, and has the internal space S5, the resonator element 6 which is accommodated in the internal space S5 and is disposed on the lower surface side of the second base substrate 51, the temperature sensor 71 which is disposed on the upper surface (the other main surface) of the second base substrate 51, the first circuit element 7 which is disposed on the upper surface side of the second base substrate 51 and includes the oscillation circuit 72 that causes the resonator element 6 to oscillate so as to generate an oscillation signal of which a temperature is compensated based on the detected temperature of the temperature sensor 71, and the second circuit element 4 which is accommodated in the outer package 2 and includes the PLL circuit 40 as the frequency control circuit, that controls the frequency of the oscillation signal output by the oscillation circuit 72. The inner package 5 and the second circuit element 4 are stacked.

According to such a configuration, the temperature sensor 71 and the resonator element 6 are thermally combined through the second base substrate 51. Therefore, it is possible to detect the temperature of the resonator element 6 by the temperature sensor 71 with higher accuracy, and thus temperature compensation by the oscillation circuit 72 becomes more accurate. Accordingly, the oscillator 1 capable of outputting a frequency signal having high accuracy is obtained. Since the inner package 5 and the second circuit element 4 are stacked in the Z-axis direction, a space is not provided between the inner package 5 and the second circuit element 4. Thus, it is possible to reduce the height of the outer package 2 and to reduce expansion of the outer package 2 in the X-axis direction and the Y-axis direction. Accordingly, it is possible to reduce the size of the oscillator 1.

Sixth Embodiment

Figure 9:
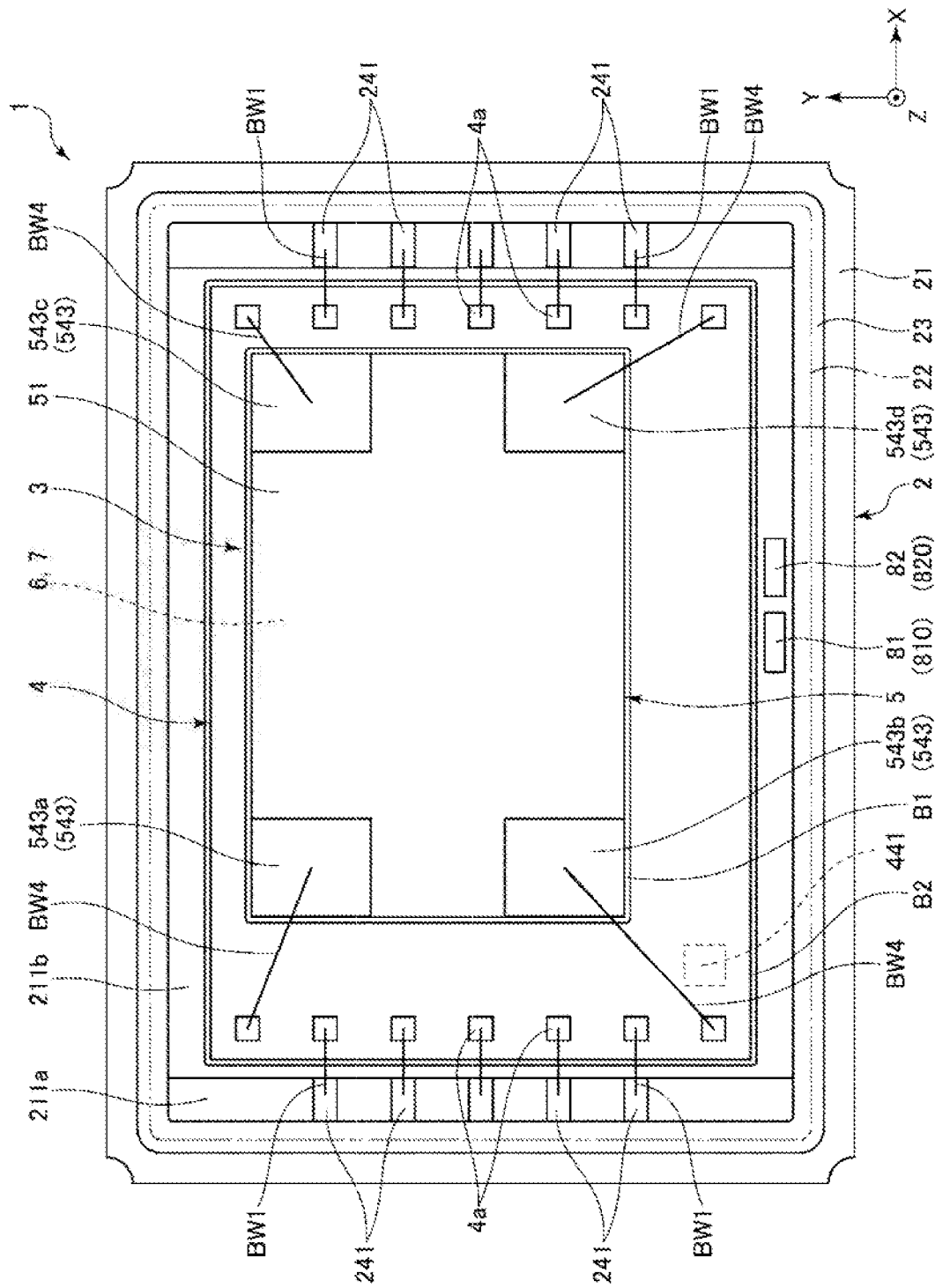
FIG. 9 is a plan view illustrating an oscillator according to a sixth embodiment.

FIG. 9 is a plan view illustrating an oscillator according to a sixth embodiment.

The sixth embodiment is similar to the above-described first embodiment except that the disposition of the discrete components 81 and 82 is different. In the following descriptions, descriptions for the sixth embodiment will be made focusing on a difference from the above-described embodiment, and descriptions of the similar items will not be repeated. In FIG. 9, components similar to those in the above-described embodiment are denoted by the same reference signs.

As illustrated in FIG. 9, in the oscillator 1 in the sixth embodiment, the recess portion 211*c* is omitted from the recess portion 211, and the discrete components 81 and 82 are disposed on the bottom surface of the recess portion 211*b*. The discrete components 81 and 82 are disposed not to overlap the second circuit element 4 and the temperature compensated crystal oscillator 3 in plan view. According to such a configuration, it is possible to reduce the height of the outer package 2 in comparison to the above-described first embodiment.

With such a sixth embodiment, it is also possible to exhibit the effects similar to those in the above-described first embodiment.

Seventh Embodiment

Figure 10:
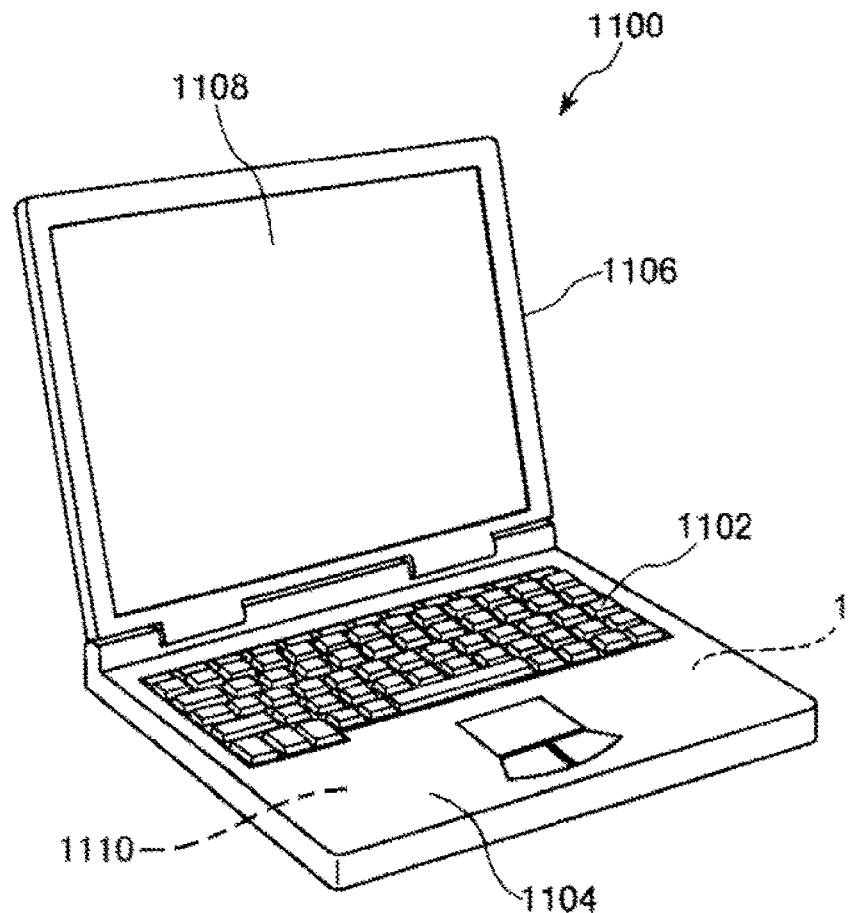
FIG. 10 is a perspective view illustrating a personal computer according to a seventh embodiment.

FIG. 10 is a perspective view illustrating a personal computer according to a seventh embodiment.

A personal computer 1100 as an electronic device illustrated in FIG. 10 includes a main body 1104 including a keyboard 1102 and a display unit 1106 including a display portion 1108. The display unit 1106 is supported to be rotatable around the main body 1104 with a hinge structure portion. The oscillator 1 is mounted in such a personal computer 1100. The personal computer 1100 includes a signal processing circuit 1110 that performs arithmetic processing relating to control of the keyboard 1102, the display portion 1108, and the like. The signal processing circuit 1110 operates based on the oscillation signal output from the oscillator 1.

As described above, the personal computer 1100 as the electronic device includes the oscillator 1 and the signal processing circuit 1110 that performs signal processing based on the output signal (oscillation signal) of the oscillator 1. Therefore, it is possible to provide the effect of the oscillator 1 described above and to exhibit high reliability.

In addition to the above-described personal computer 1100, the electronic device including the oscillator 1 includes, for example, a digital still camera, a smartphone, a tablet terminal, a watch including a smart watch, an ink jet discharge device such as an ink jet printer, a wearable terminal such as an HMD (head mounted display), a TV, a video camera, a video tape recorder, a car navigation device, a pager, an electronic notebook, an electronic dictionary, a calculator, an electronic game machine, a word processor, a workstation, a video phone, a security monitor, electronic binoculars, a POS terminal, medical equipment such as an electronic thermometer, a blood pressure monitor, a blood glucose meter, an electrocardiogram measuring device, an ultrasound diagnostic device, and an electronic endoscope, a fish detector, various measuring devices, instruments of automobiles, aircrafts, ships, a base station for a portable terminal, and a flight simulator.

Eighth Embodiment

Figure 11:
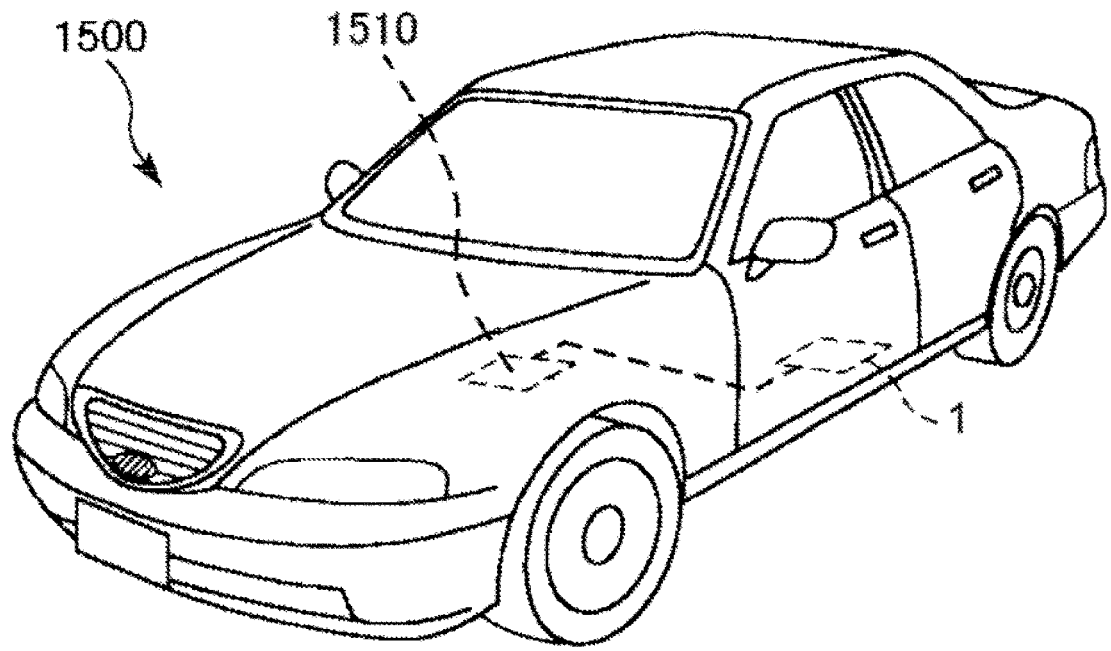
FIG. 11 is a perspective view illustrating an automobile according to an eighth embodiment.

FIG. 11 is a perspective view illustrating an automobile according to an eighth embodiment.

As illustrated in FIG. 11, the oscillator 1 and a signal processing circuit 1510 that operates based on the oscillation signal output from the oscillator 1 are mounted in an automobile 1500 as a vehicle. For example, the oscillator 1 and the signal processing circuit 1510 may be widely applied to electronic control units (ECUs) of a keyless entry, an immobilizer, a car navigation system, a car air conditioner, an anti-lock brake system (ABS), an airbag, a tire pressure monitoring system (TPMS), an engine controller, a battery monitor for a hybrid automobile or an electric automobile, and an automobile attitude control system.

As described above, the automobile 1500 as a vehicle includes the oscillator 1 and the signal processing circuit 1510 that performs signal processing based on the output signal (oscillation signal) of the oscillator 1. Therefore, it is possible to provide the effect of the oscillator 1 described above and to exhibit high reliability.

The vehicle including the oscillator 1 may be, for example, a robot, a drone, a two-wheeled automobile, an aircraft, a ship, a train, a rocket, or a spacecraft in addition to the automobile 1500.

Hitherto, the oscillator, the electronic device, and the vehicle according to the embodiments of the present disclosure are described. However, the present disclosure is not limited to the above descriptions, and the configuration of each component may be replaced with any configuration having the similar function. Any other component may be added to the present disclosure. The above-described embodiments may be appropriately combined.

What is claimed is:

1. An oscillator comprising:
a first container;
a second container accommodated in the first container;
a resonator element accommodated in the second container;
a temperature sensor accommodated in the second container;
a first circuit element that is accommodated in the second container and includes an oscillation circuit that causes the resonator element to oscillate so as to generate an oscillation signal on which temperature compensation is performed based on a detected temperature of the temperature sensor; and
a second circuit element that is accommodated in the first container and includes a frequency control circuit that controls a frequency of the oscillation signal,
wherein the second container and the second circuit element are stacked,
wherein the first container includes a first base substrate and a first lid bonded to the first base substrate, and has an internal space in which the second container and the second circuit element are accommodated,
wherein the second circuit element is mounted on the first base substrate,
wherein the second container is mounted on the second circuit element,
wherein the second container is bonded to the second circuit element through an insulating bonding member, and
wherein the second circuit element is bonded to the first base substrate through a conductive bonding member.

2. The oscillator according to claim 1, wherein
the second container includes a temperature output terminal from which an output voltage of the temperature sensor is output, and
the temperature output terminal is electrically coupled to the frequency control circuit.

3. The oscillator according to claim 1, wherein
the frequency control circuit includes an inductor, and
the second container does not overlap the inductor in plan view.

4. The oscillator according to claim 1, wherein
the second container includes a power supply terminal to which a power supply voltage to be supplied to the oscillation circuit is applied, and
the oscillator further comprises a bypass capacitor which is accommodated in the first container and is coupled to the power supply terminal.

5. An oscillator comprising:
a first container;
a second container that is accommodated in the first container and includes a first base substrate and a first lid bonded to a first main surface of the first base substrate, and has an internal space;
a resonator element that is accommodated in the internal space and is disposed on the first main surface side of the first base substrate;
a temperature sensor disposed on a second main surface side of the first base substrate;
a first circuit element that is disposed on the second main surface side of the first base substrate and includes an oscillation circuit that causes the resonator element to oscillate so as to generate an oscillation signal on which temperature compensation is performed based on a detected temperature of the temperature sensor; and
a second circuit element that is accommodated in the first container and includes a frequency control circuit that controls a frequency of the oscillation signal,
wherein the second container and the second circuit element are stacked,
wherein the first container includes a second base substrate and a second lid bonded to the second base substrate, and has an internal space in which the second container and the second circuit element are accommodated,
wherein the second circuit element is mounted on the second base substrate,
wherein the second container is mounted on the second circuit element,
wherein the second container is bonded to the second circuit element through an insulating bonding member, and
wherein the second circuit element is bonded to the second base substrate through a conductive bonding member.

6. An electronic device comprising:
the oscillator according to claim 1; and
a signal processing circuit that performs signal processing based on an output signal of the oscillator.

7. A vehicle comprising:
the oscillator according to claim 1; and
a signal processing circuit that performs signal processing based on an output signal of the oscillator.

* * * * *